United States Patent [19]

Johnston et al.

[11] Patent Number: 4,627,902

[45] Date of Patent: Dec. 9, 1986

[54] METHOD OF PRODUCING A RESISTANCE ELEMENT FOR A RESISTANCE THERMOMETER

[75] Inventors: James S. Johnston, Bognor Regis; Leslie Holland, Crawley; Christopher R. Wright, Bognor Regis, all of England

[73] Assignee: Rosemount Engineering Company Limited, England

[21] Appl. No.: 597,164

[22] Filed: Apr. 5, 1984

Related U.S. Application Data

[63] Continuation-in-part of Ser. No. 359,872, Mar. 19, 1982, abandoned.

[30] Foreign Application Priority Data

Mar. 24, 1981 [GB] United Kingdom ............... 8109239
Aug. 11, 1981 [GB] United Kingdom ............... 8124559

[51] Int. Cl.$^4$ ............................................. C23C 14/38
[52] U.S. Cl. ........................... 204/192.21; 204/192.15; 338/308; 374/185
[58] Field of Search ................... 204/192 F, 192 C; 338/25, 308; 374/185

[56] References Cited

U.S. PATENT DOCUMENTS

| 3,645,783 | 2/1972 | Rupert et al. ............... 117/212 |
| 3,833,410 | 9/1974 | Ang et al. ................... 117/227 |
| 3,845,443 | 10/1974 | Fisher ........................ 338/25 |
| 4,072,593 | 2/1978 | Diehl et al. ................. 204/192 F |
| 4,103,275 | 7/1978 | Diehl et al. ................. 338/25 |
| 4,129,848 | 12/1978 | Frank et al. ................. 338/308 |

FOREIGN PATENT DOCUMENTS

| 1014103 | 7/1977 | Canada . |
| 0061887 | 10/1982 | European Pat. Off. . |
| 1501959 | 2/1978 | United Kingdom . |
| 1522221 | 8/1978 | United Kingdom . |
| 2096645 | 10/1982 | United Kingdom . |

OTHER PUBLICATIONS

J. J. Bessot, New Vacuum Deposition Techniques, *Metal Finishing*, Apr. 1980, pp. 66-67.

Chapman, Brian, *Glow Discharge Processes: Sputtering and Plasma Etching*, John Wiley & Sons, New York, pp. 260-270.

Vossen, John L. and Kern, Werner, eds., *Thin Film Processes*, Academic Press, New York, 1978, pp. 46-50 and 157-160.

*Chemical Abstracts*, vol. 88, 1978, 88.97990a, p. 570.

Thornton, John A. and Penfold, Alan S., "Cylindrical Magnetron Sputtering", *Thin Film Processes*, John L. Vossen and Werner Kern, eds., Academic Press, New York, 1978, pp. 76-83.

Waits, Robert K., "Planar Magnetron Sputtering", *Thin Film Processes*, John L. Vossen and Werner Kern, eds., Academic Press, New York, 1978, pp. 131-136.

Bennewitz, C. D., et al., "Structural and Electrical Properties of Films Sputtered from a Pt Cathode in Argon-Oxygen Mixtures," *Journal of Applied Physics*, vol. 46, No. 2, Feb. 1975, pp. 558-567.

*Primary Examiner*—John F. Niebling
*Assistant Examiner*—William T. Leader
*Attorney, Agent, or Firm*—Kinney & Lange

[57] ABSTRACT

A resistance thermometer element having a thin layer of platinum metal on an insulating substrate is formed by magnetron sputtering in a gaseous atmosphere containing at least 10% by volume of oxygen. Any balance gas has less than 10% by volume of argon, krypton and xenon. The atmosphere may have up to 100% oxygen with any balance gas being inert to platinum. Air can be used. A planar magnetron may be used.

18 Claims, 3 Drawing Figures

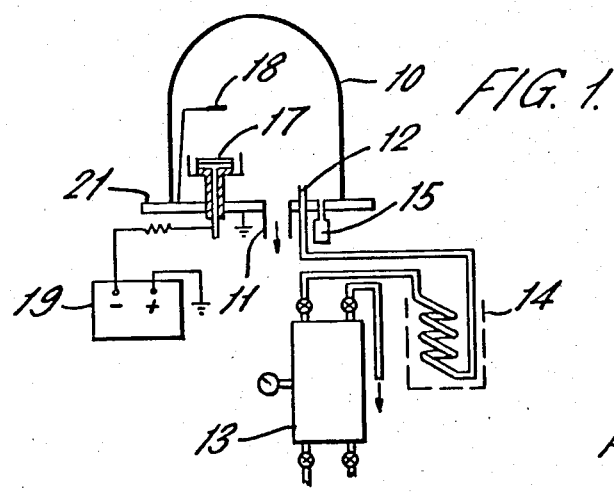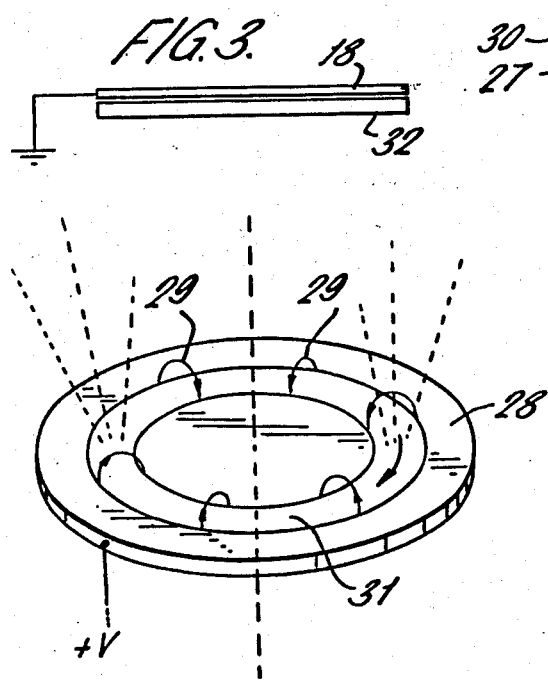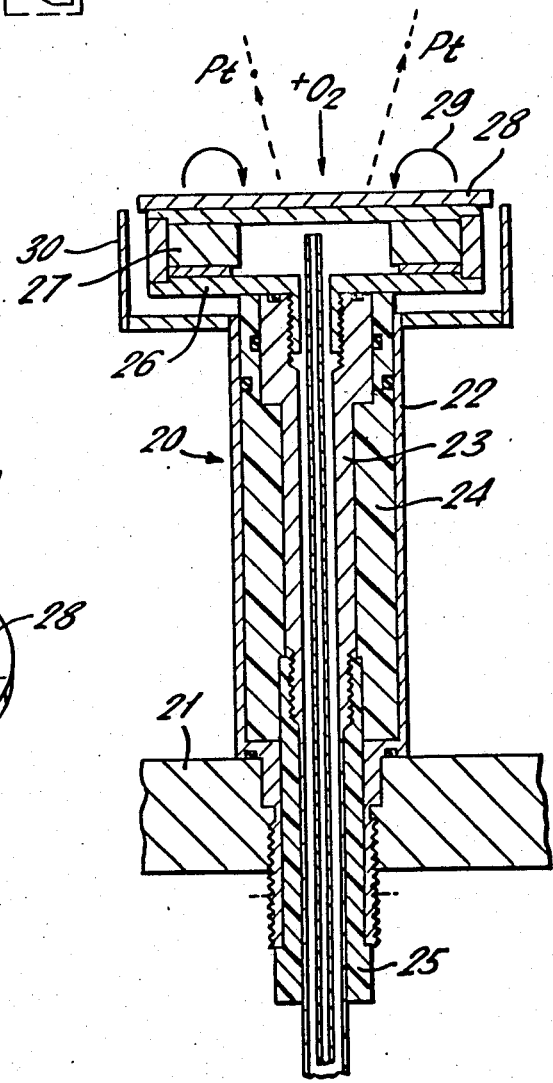

METHOD OF PRODUCING A RESISTANCE ELEMENT FOR A RESISTANCE THERMOMETER

This application is a continuation in part of our application 359,872 filed Mar. 19, 1982 for A Method of Producing a Resistance Element for a Resistance Thermometer, now abandoned.

The present invention is concerned with a method of producing a resistance element for a resistance thermometer, particularly of the form comprising a thin layer of platinum metal on an insulating substrate. It is known to produce both so-called thin and thick film devices comprising layers of conductive material on insulating substrates. In thick film devices, the conducting layer is typically formed of metal particles bound together in glass. In thin film devices the conducting layer is usually pure metal. Both thick and thin film processes have been proposed for forming resistance thermometer elements. The present invention is concerned only with thin film devices.

Thin film resistance thermometer elements have been proposed and one suggested method of manufacturing such elements is by depositing the thin metallic film on the substrate by sputtering. Great difficulty has, however, been experienced in forming such a sputtered thin film device with a temperature coefficient of resistance comparable to that of the bulk metal used in the sputtering process. For example, when sputtering platinum it has proved extremely difficult to achieve a temperature coefficient of resistance anywhere approaching the desired standard of $3.85 \times 10^{-3}$ ppm/°C.

On the other hand, a thin film resistance thermometer would present very great advantages if it could be manufactured reproducibly with a desirable temperature coefficient of resistance. The amount of platinum metal used in the device could be considerably lower than sensor elements used hitherto and the device could be made very small and manufactured relatively cheaply. Futhermore, trimming of such thin film devices to a standard ice point resistance is much facilitated.

There has, thus, over the years been considerable research effort put in to overcoming the problems of forming such a thin film resistance element with the desired temperature characteristics.

The process of sputtering comprises housing a substrate on which a layer is to be sputtered and a target of the material required to form the layer in a vacuum vessel. An atmosphere of desired gas or gas mixture at a much reduced pressure is provided in the vessel and an electric field set up to cause electrons in the atmosphere to ionise some of the gas atoms of the atmosphere. The gas ions are accelerated by the electric field to impinge on the target causing target material to be "splashed" off which can then condense onto the substrate.

In the prior art, sputtering atmospheres always include a so called high sputtering yield gas which is generally a gas of high atomic weight relative to the common light gases H, He, N, O.

For example, platinum sputtering of a thin film resistance thermometer has been proposed in an oxygen-argon atmosphere. Oxygen has been found desirable and has the effect apparently of reducing the degree of contamination of platinum which otherwise degrades the temperature coefficient of the resulting film. Argon provides the relatively high atomic weight atoms to produce a satisfactory sputtering yield. However sputtering platinum in oxygen-argon atmospheres has provided disappointing results with inferior temperature coefficient of resistance (TCR) and also a tendency for the sputtered film to have poor adherence to the substrate.

The usual substrate used for metal film type electrical devices is alumina, which has suitable refractory properties and temperature coefficient of expansion reasonably close to that of the metal used, and platinum in particular.

In UK Pat. No. 1522221 to Diehl et al (which claims priority from a German application filed in February 1975) a solution to the problem of sputtering platinum in oxygen-argon atmospheres is proposed, whereby the platinum film is deposited on a substrate having a temperature coefficient of expansion higher than that of the deposited platinum film. The resultant strain gauge effect on the platinum film presumably compensates for the inherent deficiency of the TCR. However this technique has disadvantages in the need to select the substrate material carefully and in the possibility of the deposited film becoming detached from the substrate.

U.S. Pat. No. 4,072,593 to Diehl (which claims priority from a German application filed in December 1975) achnowledges the shortcomings of using argon-oxygen atmospheres and also the solution proposed in the above UK Patent, and proposes instead to use xenon or krypton with oxygen. Good results are claimed but xenon and krypton are very expensive.

In spite of the problems of the above referred prior art specifications which date back to 1975 and the clear desirability of producing a thin film sputtered platinum resistance thermometer with a TCR at or about the industry standard $3.85 \times 10^{-3}$ ppm/°C., the applicants' herein know of no other proposals. It was the applicants own surprising discovery in accordance with the present invention that the technique known as magnetron sputtering could be used to sputter platinum in atmospheres containing oxygen but no significant proportions of argon, krypton or xenon and thereby produce sputtered films having the desired TCR.

Specifically in accordance with the invention, a method of producing a thin film platinum resistance thermometer element having a TCR of about $3.85 \times 10^{-3}$ ppm/°C. comprises magnetron sputtering a platinum film onto an insulating substrate in a sputtering atmosphere consisting of at least 10% by volume of oxygen, with any balance gas providing no significant proportion of argon, xenon or krypton in the atmosphere, and heat treating the film after sputtering to remove any entrapped oxygen from the film and reduce or dissociate platinum oxide in the film to platinum metal.

By "no significant proportion" it is meant that argon is not present in sufficient proportion to have a significant effect on the resulting TCR and that xenon and krypton are not present in sufficient proportion to have a significant effect on the cost of the process. The gaseous atmosphere may contain less than 10% and preferably substantially no krypton or xenon or argon.

The efficiency of magnetron sputtering is very much greater than the commonly used linear sputtering technique, because with magnetron sputtering, the electrons are forced to circulate for much longer in the plasma region thereby greatly increasing the number of collisions with gas atoms and producing correspondingly more ions. In fact, relatively fast sputtering rates can be achieved using magnetron sputtering even in an atmosphere of pure oxygen. The gaseous atmosphere may be primarily oxygen and one example of the invention employs pure oxygen enabling the possibility of contamination of the metal film deposited by sputtering on to the substrate to be greatly reduced. The atmosphere is desirably at least 20% and conveniently at least 50% by volume of oxygen with the balance of gas, which is inert to platinum and preferably completely excluding argon, kyrpton and xenon.

The insulating substrate may be made from one of the materials customarily used for film devices, such as alumina. There is no need to select a special substrate material having a higher temperature coefficient of expansion as in U.K. No. 1522221.

One of the problems with depositing films by sputtering is that it appears molecules of gases present in the sputtering atmosphere can be entrapped in the metal condensed on to the substrate and considerably influence the electrical properities of the resulting film. This is especially critical when forming a resistance thermometer element since the entrapment of many gases which would appear otherwise to be inert seams to reduce considerably the temperature coefficient of resistance of the resulting film. With a pure oxygen atmosphere, although some oxygen entrapment may occur, and indeed the formation of a platinum oxide in the deposited film, the entrapped oxygen is removed and the oxide reduced by heat treating the film after sputtering. It is well known for platinum that while forming oxides the reduction or dissociation of these oxides is easy to perform.

Lower concentrations of oxygen in the gaseous atmoshpere are also useful. The atmosphere may be about 20% by volume of oxygen with the balance consisting primarily of nitrogen. In fact an atmosphere of air has provided good results.

In all cases, the gaseous atmosphere should be dry, i.e. such that the partial pressure of hydrogen (from the system or water vapour dissociation) in the glow discharge is insufficient to cause reduction of the growing oxide film. However, it is not essential to exclude all water vapour.

Normally, after the sputtering process, the thin platinum layer is heat treated at between 700° C. and 1200° C. for at least five hours. This annealing, or tempering, process both allows the deposited film to flow properly together as a homogeneous metal layer and also ensures removal of any entrapped oxygen and reduction or dissociation of any oxides. The heat treating may be carried out for ten hours or more.

After the heat treating process mentioned above, the platinum layer may be scribed with a laser to form an extended path thereof. This is normally desirable to provide an element with the required ice point resistance, typically 100 ohms. Other methods of producing the path may also be employed, such as photo-etching.

After laser scribing, a further heat treatment may be provided again at temperatures between 700° C. and 1200° C. and for at least one hour. The laser scribing operation is found to somewhat impair the temperature coefficient of the film and this second heat treatment reduces this effect.

It is desirable to use in the sputtering process a sputtering target made of 99.99% pure platinum.

The pressure of the gaseous atmosphere may be between $10^{-3}$ Torr and $10^{-2}$ Torr, and preferably between $4\times10^{-3}$ and $6\times10^{-3}$ Torr, or alternatively between $6\times10^{-3}$ and $9\times10^{-3}$ Torr.

Useful results may also be obtained at higher pressures between $10^{-2}$ Torr and $10^{-1}$ Torr.

Preferably, the magnetron sputtering is performed using a planar magnetron. Desirably also the magnetron is arranged to confine electrons to drift in a closed path perpendicular to an electric field. In one example the closed path is generally circular.

Examples of the present invention will now be described with reference to the accompanying drawings in which:

FIG. 1 is a schematic illustration of apparatus for carrying out an example of the method of the present invention;

FIG. 2 is a detailed cross-sectional view of the magnetron cathode of the apparatus of FIG. 1; and FIG. 3 is a schematic illustration of the platinum target used in the magnetron of FIG. 2.

Referring to FIG. 1, platinum sputtering is carried out in a vacuum vessel 10 which is pumped out to a low pressure through a vacuum pipe 11 by a vacuum pump (not shown).

The vacuum chamber 10 contains a gaseous atmosphere at low pressure, typically between 4 and $6\times10^{-3}$ Torr comprising substantially pure oxygen supplied via a feed pipe 12 from an oxygen cylinder 13. The oxygen may be chilled in a chiller 14 prior to delivery to the vacuum chamber 10 to remove any water. The pressure of the gas in the vacuum chamber 10 may be monitored by a pressure gauge 15.

In the chamber 10, the sputtering process is carried out by means of a magnetron 17 arranged as a cathode and an anode 18. In the described example, a DC voltage from a power supply 19 is supplied to the cathode relative to earth and the anode 18 is itself earthed.

As will be explained in more detail later, the voltage between the cathode and anode sets up a glow discharge adjacent the cathode resulting the formation of positive ions of the gaseous atmosphere which are attracted to the cathode. A platinum target is provided at the cathode which is thus bombarded by the positive ions which sputter off platinum metal from the target. A substrate to be coated with the platinum metal can then be located, preferably adjacent the anode 18 and the sputtered platinum metal condenses on the surface of the substrate forming a metal film coating thereon.

Sputtering processes generally are well-established in the art. However, with typical sputtering techniques it has been normal practice to include in the gaseous atmosphere a substantial proportion of gas of relatively high atomic weight which affords a high sputtering yield (i.e. atoms sputtered per ion impact) such gases include argon, xenon or krypton. However, with a magnetron as in the present example of this invention, relatively high rate sputtering can be achieved using even pure oxygen as the atmosphere.

FIG. 2 illustrates the magnetron cathode 17 in cross-section. The magnetron assembly is mounted on a pedestal indicated generally at 20 screwed into the base 21 of the vacuum chamber 10. The pedestal comprises a metal outer sheath 22 which makes electrical contact with the base 21 and is earthed. A tubular copper electrode body 33 extends up through the metal sheath 22 of the pedestal 20 and is insulated from the sheath 22 by means of insulators 24 and 25. The copper electrode body 23 supports at its upper end a platform 26 on which are mounted an annular array of magnets 27. A target plate 28 of platinum is mounted on top of the magnets 27. The target plate 28 may comprise a circular disc of platinum metal as illustrated in FIG. 3. The magnets 27 are arranged to produce closed loops of magnetic field in radial planes extending above the target plate 28 as illustrated at 29 in FIGS. 2 and 3. Instead of several magnets 27 a single annular magnetic core may be provided having concentric north and south poles. In the present example permanent magnets are used, however, instead, electro-magnets may be employed.

The metallic sheath 22 extends radially outwardly underneath the playform 26 and then upwardly in a skirt 30 to a position just spaced from the outer peripheral edge of the target plate 28.

In operation, when a voltage is applied to the copper electrode body 23 and the chamber 10 contains a suitable gas at a low pressure, a glow discharge is formed between the plate 28 forming a cathode and the anode 18.

In the absence of the magnets 27, electrons emitted from the cathode 28 are drawn directly across towards the anode 18. If very low gas pressures are used in the chamber 10, then electrons may transverse to the anode without experiencing a single collision with a gas atom, so that the production rate of positive ions is relatively low. Any positive ions produced are attracted to the cathode 28 where they bombard the cathode to sputter off platinum material which can then be deposited or condensed on to a suitably positioned substrate.

However, in the example of the present invention, electrons within the influence of the magnetic field from the magnets 27 are influenced by this field and are effectively trapped inside closed field lines 29. The trapped electrons tend to drift perpendicular to the plane of the magnetic field lines. Since, as can best be seen in FIG. 3, the magnets 27 are arranged to provide a closed annulus of the magnetic field lines above the target plate 28, the drifting electrons are constrained to circulate around the closed path 31. With such an arrangement, even with relatively low gas pressures in the chamber 10, electrons continue circulating until they experience one or more collisions with gas atoms. In this way the available electrons are employed much more efficiently and a much higher proportion of gas ions are produced thereby greatly increasing the rate of sputtering and the resultant rate of deposition of material on the substrate.

As shown best in FIG. 3, the anode 18 is connected to earth and is located substantially on the axis of symmetry of the target plate 28. The substrate to be coated is preferably located immediately adjacent the anode 18 as at 32. In other arrangements the anode need not be earthed, i.e. if it is biassed relative to earth.

Since the electrons are constrained to circulate within the loops of magnetic field 29, the glow discharge is produced in a corresponding annulus and the resulting positive ions are attracted to impinge on the underlying surface portion of the target plate 28. The annular surface region thus defined is known as the area of erosion and during the sputtering process, platinum is sputtered off from this area and can condense on the substrate 32.

An important feature of the present invention is that satisfactory sputtering rates can be achieved without the addition of high atomic weight inert gases such as argon, xenon and krypton in the gaseous atmosphere. Thus, relatively high proportions of oxygen in the gaseous mixture can be employed and any balance of gas in the atmosphere can be a suitably platinum-inert gas of relatively low atomic weight. In particular, the present invention excludes the use of significant amounts of krypton, xenon or argon as balance gases.

Indeed, in a preferred example of the invention, a substantially pure oxygen atmosphere is employed and very satisfactory sputtering efficiency and resultant deposition rates are achieved.

The use of oxygen in the atmosphere improves the quality of the film deposited on the substrate. A proportion of the metal sputtered from the platinum target in an oxygen atmosphere is believed to be in oxide form and the combination of oxide deposition together with entrapped oxygen at the substrate provides an improved quality of deposited film. With a pure oxygen atmosphere, problems associated with entrapment of any balance gases in the atmosphere are substantially obviated.

It is most desirable to use 99.99% pure platinum for the target plate 28.

In a particular example of the invention, a substrate of aluminum oxide was coated with platinum in the apparatus of FIG. 1. A negative voltage of 800 v was applied to the cathode 17 and the chamber 10 contained pure dry oxygen at a pressure of $5 \times 10^{-3}$ Torr. A current of 240 mA was caused to flow through the cathode at a power of about 192 W forming an annular glow discharge above the surface of the platinum target plate 28. Platinum was deposited on the substrate at a rate of 900 Å per minute to a depth of 20,000 Å.

After sputtering, the coated device was heat treated at a temperature of 1000° C. for ten hours. The device was then scribed with a laser to form an elongate path of the platinum film to provide the necessary ice point resistance of the device. After laser scribing, the device was again heat treated at 1000° C. for 2½ hours.

The resultant device was found to have a sheet resistivity of $53 \pm 3$ ml/□ and a temperature coefficient of resistance of $3841 \pm 1$ ppm/°C. The adhesion of the film to the substrate was found to be good. Aluminum oxide has a temperature coefficient of expansion which is a good match to that of the platinum film.

Although in the above described example, a planar circular magnetron was used in DC mode, other forms of magnetron may be employed in the method of the present invention. The purpose of the magnetron arrangement is to deflect the electrons repelled by the cathode into substantially closed paths to improve the efficiency of forming positive ions from the available gas atmosphere The magnetron surface may be curved and the track or closed path in which the electrons are confined may be any regular or irregular shape. Also, radio frequency voltages may be applied to the magnetron in such a way as to induce a negative bias on at least one of the electrodes (if more than one) providing the closed electron path.

A further advantage of the use of a magnetron as described is also that relatively low anode/cathode voltages are required because the plasma or glow discharge is formed only immediately adjacent the target plate at the cathode.

Although the above example uses dry oxygen in the gaseous atmosphere, some water vapour may be included, provided the quantity present is insufficient for the partial pressure of hydrogen in the glow discharge to cause reduction of the growing oxide film. In the examples described the gas is dried by liquid nitrogen when fed into the chamber 10, and by "cold fingers" in the chamber which are also cooled with liquid nitrogen.

In another example, the chamber 10 contained dry air (about 0.9% of argon by volume) at $7.5 \times 10^{-3}$ Torr. A negative voltage of 460 v was applied to the cathode 17 and a current of 200 mA was caused to flow through the cathode at a power of about 92 W. Platinum was deposited on the substrate at a rate of 650 Å per minute to a depth of about 20,000 Å.

The coated device was then heat treated and scribed as before. Eighteen resulting devices were formed in this manner and found to have a sheet resistivity of 55 m$\Omega$/□, and $\alpha$- values of 3850± 4 ppm/°C.

Further experiments showed that these results could be obtained with less consistency, at much higher pressures, say, up to $10^{-1}$ Torr. Such higher pressures greatly simplify the process, requiring a less sophisticated vacuum system.

What is claimed is:

1. A method of producing a thin film platinum resistance thermometer element having a TCR of about $3.85 \times 10^{-3}$ ppm/°C. which comprises magnetron sputtering a platinum film onto an insulating substrate in a sputtering atmosphere consisting of at least about 20% by volume of oxygen, with the balance gas consisting primarily of nitrogen, and heat treating the film after sputtering to remove any entrapped oxygen from the film and reduce or dissociate platinum oxide in the film to platinum metal.

2. A method as claimed in claim 1 and including heat treating the thin platinum layer after sputtering at between 700° C. and 1200° C. for at least 5 hours.

3. A method as claimed in claim 2 wherein said heat treating is carried out for at least 5 to 10 hours.

4. A method as claimed in claim 3 wherein said heat treating is carried out for about 20 hours.

5. A method as claimed in claim 1 and including the further step, after said heat treating, of scribing the platinum layer with a laser to form an extended path thereof.

6. A method as claimed in claim 5 and including the futher step, after said laser scribing, of further heat treating the scribed platinum layer at between 700° C. and 1200° C. for at least 1 hour.

7. A method as claimed in claim 1 wherein said gaseous atmosphere is at least 50% by volume of oxygen.

8. A method as claimed in claim 1 wherein said gaseous atmosphere is about 20% by volume of oxygen.

9. A method as claimed in claim 8 wherein said gaseous atmosphere is air.

10. A method as claimed in claim 1 wherein the sputtering target used is 99.99% pure platinum.

11. A method as claimed in claim 1 wherein the pressure of said gaseous atmosphere is between $10^{-3}$ Torr and $10^{-2}$ Torr.

12. A method as claimed in claim 11 wherein the pressure is between $4 \times 10^{-3}$ Torr and $6 \times 10^{-3}$ Torr.

13. A method as claimed in claim 11 wherein the pressure is between $6 \times 10^{-3}$ Torr and $9 \times 10^{-3}$ Torr.

14. A method as claimed in claim 1 wherein the pressure of said gaseous atmosphere is between $10^{-2}$ Torr and $10^{-1}$ Torr.

15. A method as claimed in claim 1 using a planar magnetron.

16. A method as claimed in claim 15 wherein the magnetron is arranged to confine the electrons to drift in a closed path perpendicular to an electric field.

17. A method as claimed in claim 16 wherein the closed path is generally circular.

18. A method of producing a thin film platinum resistance thermometer element having a TCR of about $3.85 \times 10^{-3}$ ppm/°C. which comprises magnetron sputtering a platinum film onto an insulating substrate in a substantially pure oxygen sputtering atmosphere, and heat treating the film after sputtering to remove any entrapped oxygen from the film and reduce or dissociate platinum oxide in the film to platinum metal.

* * * * *